United States Patent
Blum

(10) Patent No.: US 7,586,336 B2
(45) Date of Patent: Sep. 8, 2009

(54) METHOD AND CIRCUIT FOR SQUELCH DETECTION IN SERIAL COMMUNICATIONS

(75) Inventor: Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 391 days.

(21) Appl. No.: 11/338,526

(22) Filed: Jan. 23, 2006

(65) Prior Publication Data

US 2007/0173216 A1     Jul. 26, 2007

(51) Int. Cl.
*H03K 5/22* (2006.01)

(52) U.S. Cl. .......................................... 327/63; 327/65

(58) Field of Classification Search ........................ None
See application file for complete search history.

(56) References Cited

U.S. PATENT DOCUMENTS

| 4,627,102 | A | 12/1986 | Nott ........................... 455/221 |
| 4,783,845 | A | 11/1988 | McChesney et al. .......... 455/35 |
| 5,210,518 | A | 5/1993 | Graham et al. .......... 340/310 R |
| 6,628,145 | B1 * | 9/2003 | Sudjian ....................... 326/115 |
| 6,859,645 | B2 | 2/2005 | Yu .............................. 455/222 |
| 6,998,877 | B2 * | 2/2006 | Lin ............................. 326/104 |
| 7,113,754 | B2 * | 9/2006 | Chien ...................... 455/115.3 |
| 7,116,948 | B2 * | 10/2006 | Chien ...................... 455/115.3 |
| 2002/0008581 | A1 * | 1/2002 | Callahan, Jr. ............... 330/254 |
| 2003/0112058 | A1 | 6/2003 | Park ........................... 327/551 |
| 2003/0141912 | A1 * | 7/2003 | Sudjian ....................... 327/208 |
| 2003/0148746 | A1 | 8/2003 | Taylor ..................... 455/174.1 |
| 2004/0015093 | A1 * | 1/2004 | Knapp et al. ................ 600/538 |
| 2005/0054311 | A1 | 3/2005 | Komatsu et al. ............ 455/219 |

FOREIGN PATENT DOCUMENTS

EP     0 843 413     5/1998

* cited by examiner

*Primary Examiner*—Tuan Lam
*Assistant Examiner*—Hiep Nguyen

(57) ABSTRACT

A method, algorithm, architecture, circuits, and/or systems for squelch detection in serial communications are disclosed. In one embodiment, a squelch detector can include: (i) a first comparator having first and second inputs configured to receive a differential signal, and a third input configured to receive a signal substantially derived from the differential signal, where the first comparator can provide a comparator output; and (ii) a second comparator that can receive the comparator output and a reference voltage, and may provide a logic level squelch indication. The third input signal may be a common reference signal that is approximately an average voltage of the differential signal, for example. The first comparator may comprise a three-input comparator and the second comparator may comprise a two-input hysteresis comparator, for example. Embodiments of the present invention can advantageously provide a reliable and simplified approach for squelch detection in serial communication applications.

18 Claims, 6 Drawing Sheets

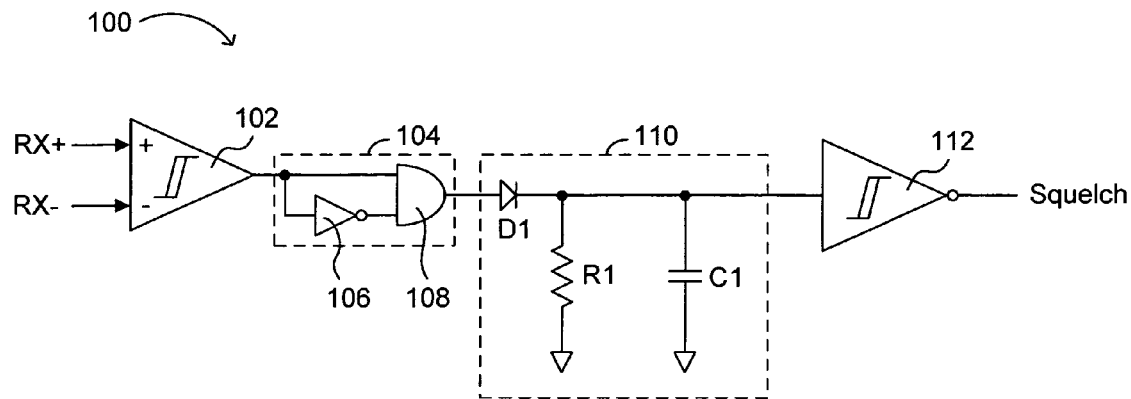
FIG. 1 (conventional)

US 7,586,336 B2

METHOD AND CIRCUIT FOR SQUELCH DETECTION IN SERIAL COMMUNICATIONS

FIELD OF THE INVENTION

The present invention generally relates to the field of serial communications circuits. More specifically, embodiments of the present invention pertain to methods, algorithms, architectures, circuits, and/or systems for squelch detection in serial communications.

DISCUSSION OF THE BACKGROUND

In many serial communications systems, there is often a need to determine whether a valid input signal is present. Typically, this can be accomplished by first detecting the amplitude of an incoming signal. If the amplitude is less than a predetermined value, the signal may be considered invalid. On the other hand, if the amplitude is greater than the predetermined value, the signal may be considered valid. The rationale behind this general approach is to substantially eliminate the possibility of random noise appearing like a signal when there may actually be no usable signal present. A squelch detector is typically used in serial communications to suppress (e.g., via a logic level squelch indication) an input if that input is detected to be below or within the predetermined value or threshold. Accordingly, an input signal may not be considered "valid" and may instead be considered "squelch" or invalid until that signal is outside a predetermined invalid range or greater than the threshold.

Referring now to FIG. 1, a schematic diagram showing a conventional squelch detector circuit (see, e.g., U.S. Patent Application Publication No. 2003/0112058) is indicated by the general reference character 100. This approach includes hysteretic comparator 102, followed by edge detector 104, peak detector 110, and another hysteretic comparator 112. Comparator 102 may take differential signal RX+/RX−, provide a gain of the differential signal by a fixed amount, and then convert the differential signal to a single-ended signal. Edge detector 104, including delay/inverter 106 and AND gate 108, may only trip if its threshold is exceeded (e.g., the signal from comparator 102 is sufficiently long). If the signal from comparator 102 is sufficiently long, edge detector 104 may output a pulse of fixed duration (e.g., based on the amount of delay in delay/inverter 106). Peak detector 110, including diode D1, resistor R1, and capacitor C1, may then sample the signal from edge detector 104 and hold the latest value for an amount of time, as determined by the RC time constant of peak detector 110. As long as another signal edge or transition is detected by edge detector 104 prior to the decay of the signal at the output of peak detector 110, this voltage can be sustained and a continuously valid squelch signal may result. Comparator 112 can then convert the output of peak detector 110 into a logic level (e.g., "0" or "1") by comparing this peak detected value to a fixed reference (not shown).

One drawback of conventional approaches, such as that shown in FIG. 1, is the overall complexity of the architecture. What is needed is a reliable and simplified approach for squelch detection suitable for serial communication applications.

SUMMARY OF THE INVENTION

Embodiments of the present invention relate to methods, algorithms, architectures, circuits, and/or systems for squelch detection in serial communications.

In one embodiment, a squelch detector can include: (i) a first comparator having first and second inputs configured to receive a differential signal, and a third input configured to receive a signal substantially derived from the differential signal, where the first comparator can provide a comparator output; and (ii) a second comparator that can receive the comparator output and a reference voltage, and may provide a logic level squelch indication. The third input signal may be a common reference signal that is approximately an average voltage of the differential signal, for example. The first comparator may be a three-input comparator and the second comparator may be a two-input hysteresis comparator, for example.

In another embodiment, a method of detecting squelch in a serial communication system can include the steps of: (i) deriving a common reference signal from a received differential signal; (ii) comparing the received differential signal to the common reference signal to provide a comparator output; and (iii) comparing the comparator output to a reference voltage to indicate a valid signal. The method can further include the step of enabling the valid signal detection, for example.

In another embodiment, a comparator circuit for squelch detection can include: (i) first and second transistors coupled to a first node, where the first and second transistors are controllable by a differential signal; (ii) a third transistor coupled to a second node, where the third transistor is controllable by a common reference signal, and where the first node may be charged higher than the second node when either of true or complement components of the differential signal is lower than the common reference signal by a predetermined amount; and (iii) a differential amplifier stage that can receive signals at the first and second nodes and provide a comparator output. A plurality of bias signals control currents through the first, second, and third transistors and the differential amplifier stage. The comparator circuit can further include or provide a gain correlated to sizes of the first, second, and third transistors, and output transistors in the differential amplifier stage.

Embodiments of the present invention can advantageously provide a reliable and simplified approach for squelch detection in serial communication applications. Further, embodiments of the present invention can advantageously provide a valid input signal or squelch indication using a three-input comparator. These and other advantages of the present invention will become readily apparent from the detailed description of preferred embodiments below.

BRIEF DESCRIPTION OF THE DRAWINGS

FIG. 1 is a schematic diagram showing a conventional squelch detector circuit.

DETAILED DESCRIPTION OF THE PREFERRED EMBODIMENTS

Figure 2:
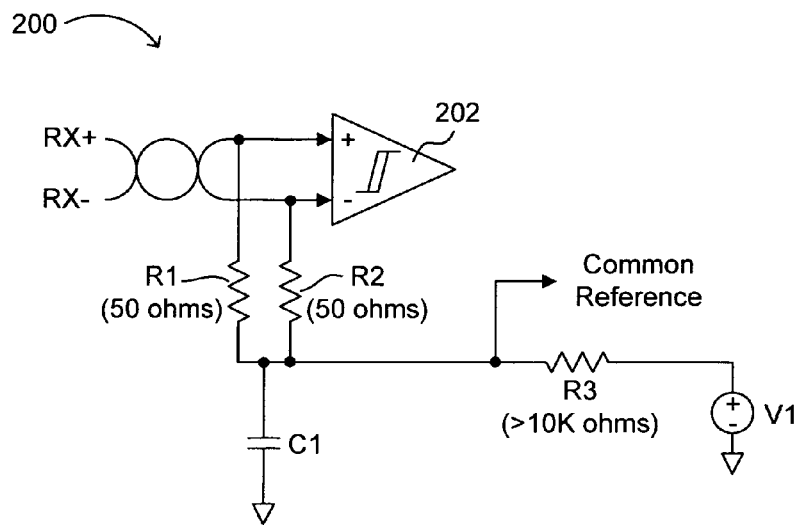
FIG. 2 is an exemplary schematic diagram showing a common termination of true and complement components of a differential signal suitable for use in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, architectures, circuits, and/or systems for squelch detection in serial communications. For example, a squelch detector can include: (i) a first comparator having first and second inputs configured to receive a differential signal, and a third input configured to receive a signal substantially derived from the differential signal, where the first comparator can provide a comparator output; and (ii) a second comparator that can receive the comparator output and a reference voltage, and may provide a logic level squelch indication. The third input signal may be a common reference signal that is approximately an average voltage of the differential signal, for example. The first comparator may be a three-input comparator and the second comparator may be a two-input hysteresis comparator, for example.

In another aspect of the invention, a three-input comparator circuit for squelch detection (e.g., a valid signal indication) can include: (i) first and second transistors coupled to a first node, where the first and second transistors are controllable by a differential signal; (ii) a third transistor coupled to a second node, where the third transistor is controllable by a common reference signal, and where the first node may be charged higher than the second node when either of true or complement components of the differential signal is lower than the common reference signal by a predetermined amount; (iii) a differential amplifier stage that can receive the first and second nodes and provide a comparator output; and (iv) a plurality of bias signals that can control currents through the first, second, and third transistors and the differential amplifier stage. The comparator circuit can further include or provide a gain correlated to sizes of the first, second, and third transistors, and output transistors in the differential amplifier stage.

In another aspect of the invention, a method and/or algorithm of detecting squelch in a serial communication system can include the steps of: (i) deriving a common reference signal from a received differential signal; (ii) comparing the received differential signal to the common reference signal to provide a comparator output; and (iii) comparing the comparator output to a reference voltage to indicate a valid signal. The method can further include the step of enabling the valid signal detection, for example.

The invention further relates to hardware implementations of the present architecture, method and circuit. Embodiments of the present invention can advantageously provide a reliable and simplified approach for squelch detection in serial communication applications. Further, embodiments of the present invention can advantageously provide a logic level valid or squelch indication using a three-input comparator. The invention, in its various aspects, will be explained in greater detail below with regard to exemplary embodiments.

According to various embodiments of the present invention, an architecture or circuit for squelch detection can include a three-input comparator. An output of this three-input comparator may then be fed into another comparator stage in order to convert the output to a logic level (e.g., a "1" or a "0") signal. For the three-input comparator, first and second inputs may be a differential signal, and a third input may be a signal substantially derived from the differential signal.

Referring now to FIG. 2, an exemplary schematic diagram showing a common termination of true and complement components of a differential signal suitable for use in accordance with embodiments of the present invention is indicated by the general reference character 200. In a configuration that is typical for many differential receiver designs, 50 ohm resistors, R1 and R2, may be placed between differential input signal true and complement components (e.g., RX+/RX−) and a common point, or common reference. Because, RX+/RX− may be differential signal components, this common mode reference signal can have the DC average (e.g., common mode) of these true and complement components as its voltage. Accordingly, where a differential signal is DC-balanced (e.g., balanced about an average DC voltage) or direct-coupled, the common reference signal can provide a relatively fixed voltage for a particular system connection or configuration. Capacitor C1, resistor R3, and power/voltage supply V1 can further stabilize the voltage at the common reference signal. This common reference signal may be used as the third input of a three-input comparator in accordance with embodiments of the present invention. Exemplary voltages for the common reference may be from about zero volts to about 0.5 V, but may be higher in some applications.

An Exemplary Squelch Detector

An exemplary squelch detector can include: (i) a first comparator having first and second inputs configured to receive a differential signal, and a third input configured to receive a signal that can be substantially derived from the differential signal, where the first comparator can provide a comparator output; and (ii) a second comparator that can receive the comparator output and a reference voltage, and may provide a logic level squelch or valid signal indication. The third input signal may be a common reference signal that is approximately an average voltage of the differential signal, for example. The first comparator may be a three-input comparator and the second comparator may be a two-input hysteresis comparator, for example.

Figure 3:
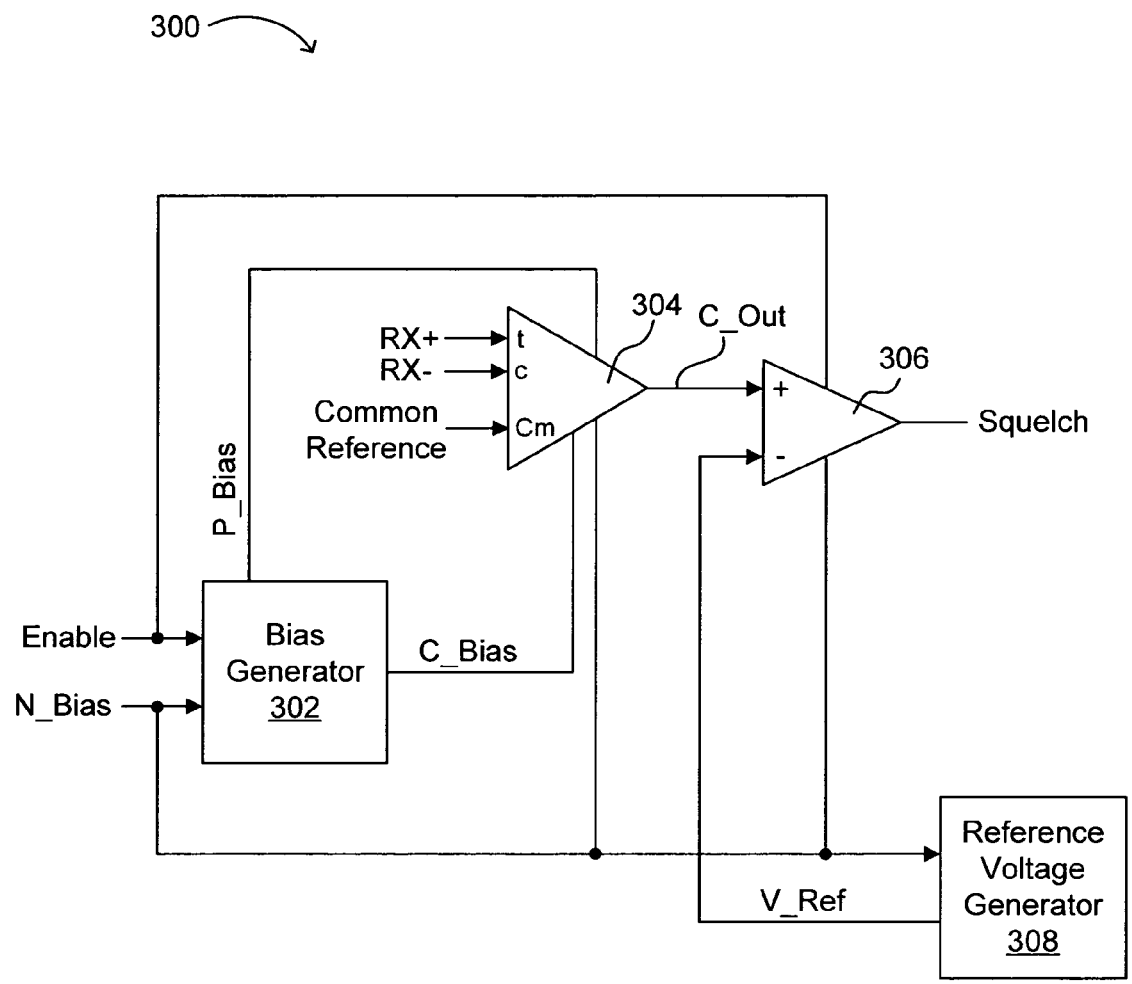
FIG. 3 is an exemplary block schematic diagram showing a squelch detector in accordance with embodiments of the present invention.

Referring now to FIG. 3, an exemplary block schematic diagram showing a squelch detector in accordance with embodiments of the present invention is indicated by the general reference character 300. Bias generator 302 can receive an enable signal and an incoming bias signal (e.g., N_Bias) and may generate two bias signals therefrom: P_Bias and C_Bias. Both P_Bias and C_Bias may be used in three-input comparator 304. Three-input comparator 304 can receive a differential input signal RX+/RX− (e.g., true and complement differential signal components), as well as a common reference signal, as discussed above. An output of three-input comparator 304 (e.g., C_Out) can then be compared against a reference signal (e.g., V_Ref) in two-input comparator 306. Reference voltage generator 308 can receive bias signal N_Bias and provide V_Ref. Two-input comparator 306 can also receive the enable signal and bias signal N_Bias, and may produce a logic level squelch indication. Two-input comparator 306 may be disabled (e.g., the enable signal may be low and/or N_Bias may be discharged) when squelch detection is inactive, such as upon circuit power-up and/or when squelch detection is otherwise not required (e.g., a known state of no differential input signal transitioning), for example.

Once the gain of the three-input comparator (e.g., comparator 304) is known, second comparator 306 can be used to compare the output of the three-input comparator (e.g., C_Out) to a reference voltage (e.g., V_Ref) to determine if the voltage difference may result in a state change of the final output (e.g., squelch indication). Second comparator 306 may contain hysteresis so that any noise and/or switching crossover of inputs C_Out and V_Ref can be filtered out. Also, three-input comparator 304 may have a relatively slow transient response so that C_Out may not be significantly changed as a function of high-speed differential input signal crossover voltages. Such a condition can occur when a digital (e.g., full logic level, as opposed to small-signal) differential signal is being transmitted, for example.

Figure 4:
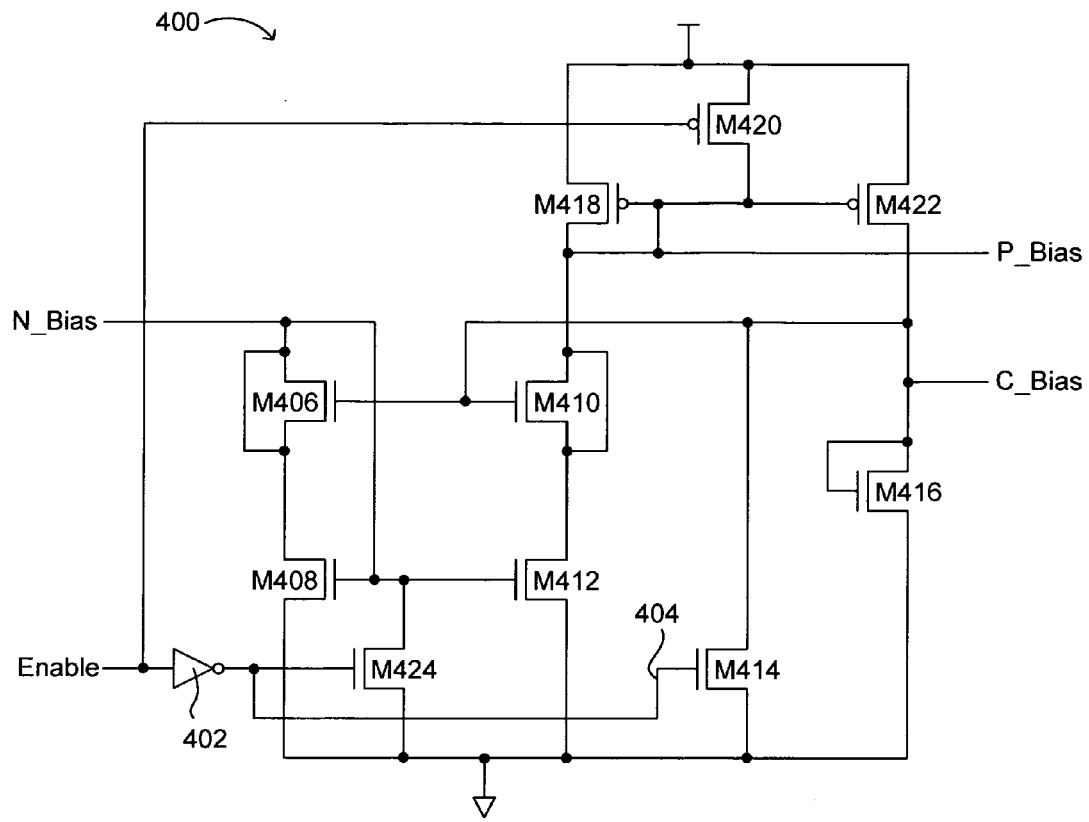
FIG. 4 is an exemplary schematic diagram showing a bias generator suitable for use in accordance with embodiments of the present invention.

Referring now to FIG. 4, an exemplary schematic diagram showing a bias generator suitable for use in accordance with embodiments of the present invention is indicated by the general reference character 400. Circuit 400 may be bias generator 302 of FIG. 3, for example. In FIG. 4, N_Bias can be supplied to circuit 400, along with an enable signal (e.g., "Enable"). Enable can connect to the gate of PMOS transistor M420, as well as to the input of inverter 402. Node 404 can be an output of inverter 402 and may connect to the gates of NMOS transistors M424 and M414. When enable is low, bias generator 400 can be disabled by N_Bias being discharged via M424, C_Bias being discharged via M414, and P_Bias being charged to VDD via M420. In this fashion, bias generator 400 can be "turned-off" in order to save current when disabled. Bias generator 400 may be disabled upon circuit power-up and/or when squelch detection is not required (e.g., squelch detection is inactive), for example.

When circuit 400 is enabled (e.g., enable is high), because NMOS transistor M406 is effectively bypassed (e.g., by a metal-option to allow for current adjustment), the gate and drain of NMOS transistor M408 may be connected together, and a current through M408 can be mirrored through the branch formed by diode-connected PMOS transistor M418, NMOS transistor M410 (which is effectively bypassed, perhaps by a metal-option), and NMOS transistor M412. This branch current can set the level of P_Bias. In turn, P_Bias can bias PMOS transistor M422 to regulate current flow through the branch including diode-connected NMOS transistor M416, to set the voltage level of C_Bias. Exemplary values of the bias levels may include a P_Bias of about 1-2 $V_t$'s (threshold voltages) or diode drops below an upper supply rail (e.g., Vdd or Vcc), an N_Bias of about 1-2 $V_t$'s or diode drops above a ground level (e.g., Vss), and a C_Bias of about (N_Bias+$\Delta$V), where in some examples, $\Delta$V may be from about 100 mV to about 500 mV (and preferably from about 200 mV to about 300 mV in the application[s] described herein).

Figure 5:
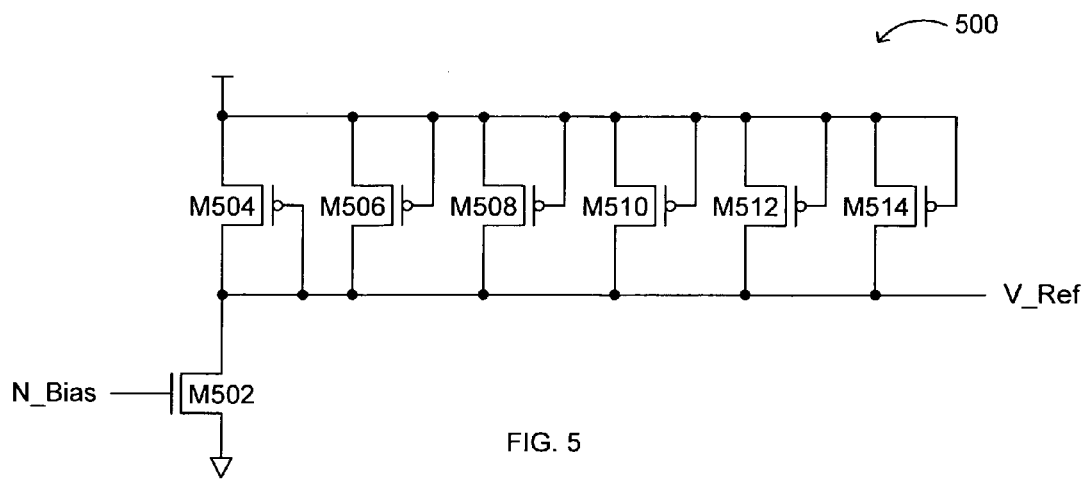
FIG. 5 is an exemplary schematic diagram showing a reference voltage generator suitable for use in accordance with embodiments of the present invention.

Referring now to FIG. 5, an exemplary schematic diagram showing a reference voltage generator suitable for use in accordance with embodiments of the present invention is indicated by the general reference character 500. Circuit 500 may be reference voltage generator 308 of FIG. 3, for example. In FIG. 5, N_Bias can be received at the gate of NMOS transistor M502. PMOS transistor M504 can be biased on, while PMOS transistors M506, M508, M510, M512, and M514 may generally be turned-off. The PMOS transistors shown in FIG. 5 may also be implemented with metal layer options in order to make adjustments for optimization of the reference voltage level, V_Ref. Alternatively, control logic may be employed to enable/disable such transistors for reference level adjustment purposes, for example. Accordingly, PMOS transistors M506, M508, M510, M512, and M514, may allow the voltage level of V_Ref to be selectable by using metal mask options, programmable configuration bits, and/or control signals (e.g., using a pseudo-digital selector). In a further embodiment, PMOS transistors M506, M508, M510, M512, and M514 may be sized in a manner enabling a digitally selectable V_Ref value, as may be known in the art.

An Exemplary Three-Input Comparator Circuit for Squelch Detection

An exemplary three-input comparator circuit for squelch detection can include: (i) first and second transistors coupled to a first node, where the first and second transistors are controllable by a differential signal; (ii) a third transistor coupled to a second node, where the third transistor is controllable by a common reference signal, and where the first node may be charged higher than the second node when either of the true or complement components of the differential signal is lower than the common reference signal by a predetermined amount; (iii) a differential amplifier stage that can receive the first and second nodes and provide a comparator output; and (iv) a plurality of bias signals that can control currents through the first, second, and third transistors and the differential amplifier stage. The three-input comparator circuit can further include or provide a gain correlated to sizes of the first, second, and third transistors, and output transistors in the differential amplifier stage.

Figure 6:
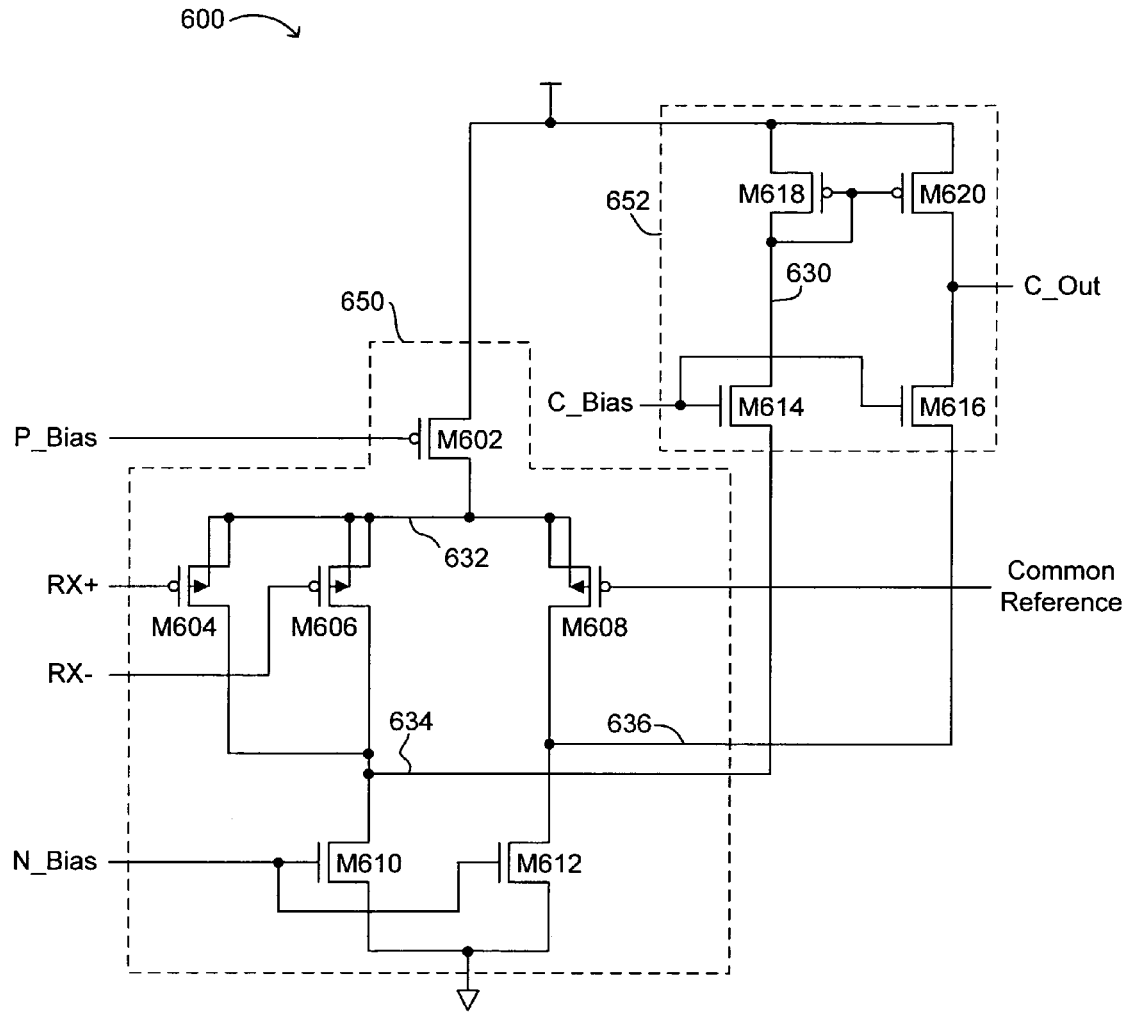
FIG. 6 is an exemplary schematic diagram showing a three-input comparator in accordance with embodiments of the present invention.

Referring now to FIG. 6, an exemplary schematic diagram showing a three-input comparator in accordance with certain embodiments of the present invention is indicated by the general reference character 600. Circuit 600 may be three-input comparator 304 of FIG. 3, for example. In FIG. 6, three-input comparator 600 can generally include comparator stage 650 and differential amplifier stage 652. Three-input comparator 600 can convert a differential signal (e.g., true and complement components, RX+/RX−) into a DC voltage level (e.g., C_Out) with respect or amplified as compared to a common reference signal (e.g., "Common Reference"). As discussed above, the common reference signal may be substantially derived from the differential signal input (e.g., RX+/RX−) and chosen such that its value is approximately the average (e.g., the common mode) of the true and complement differential input signal component voltage levels.

PMOS transistors M604 and M606 can be connected to nodes 632 and 634, and may be controllable by differential signal RX+/RX−. PMOS transistor M608 may be connected to nodes 632 and 636, and M608 may be controllable by the common reference signal. In operation, when either of RX+/RX− is lower than the common reference signal, node 634 may be charged higher (e.g., have a higher voltage level) than node 636. Differential amplifier stage 652 can include PMOS transistors M618 and M620 having a common gate connection at node 630, and NMOS transistors M614 and M616 having a common gate connection to C_Bias. The source of transistor M614 can receive or be coupled to node 634 and the source of transistor M616 can receive or be coupled to node 636. Differential amplifier stage 652 can essentially amplify the signals at nodes 634 and 636 by allowing current through (e.g., by turning on transistor M616 or allowing more current through M616 than M614) when node 636 is less than C_Bias minus the threshold voltage of transistor M616, thus discharging C_Out. Further, bias signals (e.g., P_Bias, N_Bias, and C_Bias) can control currents through transistors M604, M606, and M608 and differential amplifier stage 652.

A gain of three-input comparator 600 can be set by: (i) sizing the input transistors (e.g., M604, M606, and M608); (ii) controlling the current through these devices (e.g., by use of bias signals P_Bias via M602 and N_Bias via M610/M612); (iii) sizing of the output transistors (e.g., M618 and M620); and/or (iv) controlling the current through the output transistors (e.g., by use of bias signal C_Bias via M614/M616). In one implementation, the input threshold to be detected was from about 50 mV to about 200 mV peak-to-peak, so the gain was chosen to be relatively small (e.g., from about 5 to about 6, or, preferably, about 5.5). However, gain values suitable for use in accordance with embodiments of the present invention may be from about 1 to about 20, depending on the particular application. According to various embodiments of the present invention, this gain may be adjusted so as to suit the specific receiver levels desired in a particular application. In other applications in accordance with embodiments of the present invention, the input threshold to be detected may be at least 20 mV, for example.

Figure 7:
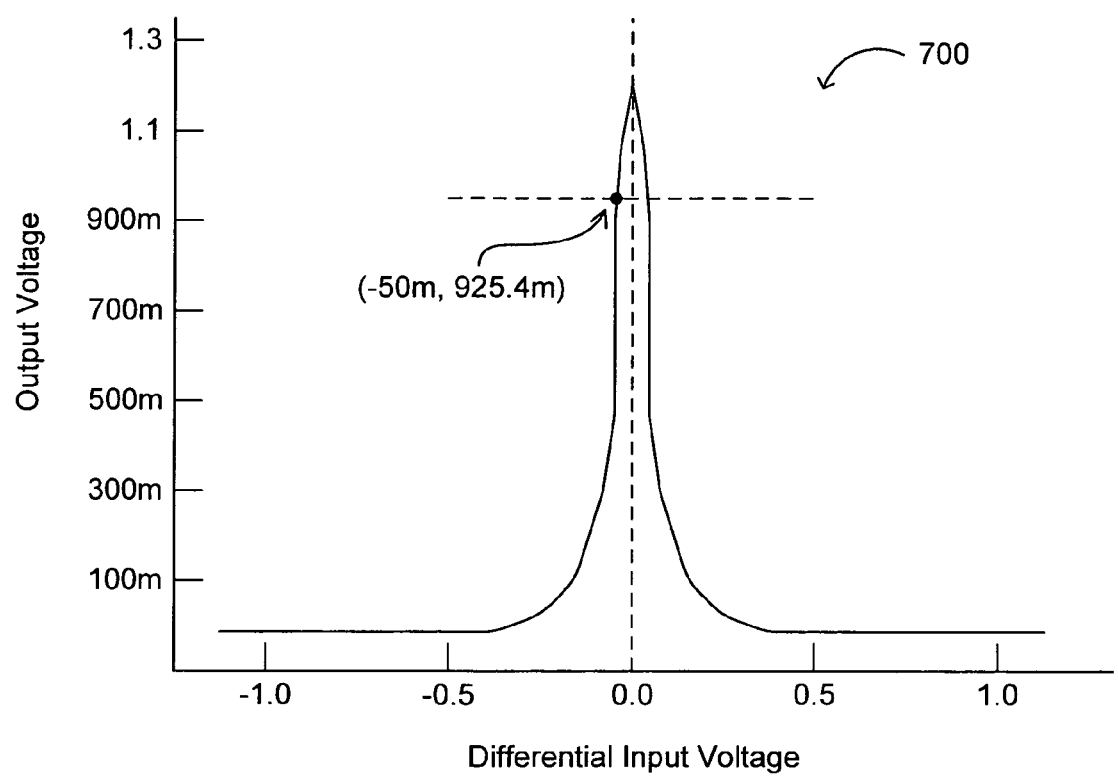
FIG. 7 is an exemplary waveform diagram showing a transfer function for the three-input comparator of FIG. 6.

Referring now to FIG. 7, an exemplary waveform diagram showing a transfer function for the three-input comparator of FIG. 6 is indicated by the general reference character 700. As shown, the voltage of the output (e.g., C_Out) of the exemplary three-input comparator (e.g., comparator 600 of FIG. 6) goes low from a maximum value whenever either true or complement differential input signal component (e.g., RX+ or RX−) is less than the common reference signal. The output voltage may be essentially low when either differential input signal component is less than a predetermined value. Such a low output voltage can correspond to a valid differential signal input or a non-squelch condition. Because the common reference signal may be the average (e.g., common mode) of the two differential input signal components, the output may generally decrease from a maximum value that is obtained when all inputs (e.g., RX+, RX−, and common reference of FIG. 6) are equal. For example, at a differential input voltage difference of −50 mV, a three-input comparator output level can be 925.4 mV, which is less than the maximum output voltage value, as shown.

Exemplary Method of Detecting Squelch

An exemplary method of detecting squelch in a serial communication system can include the steps of: (i) deriving a common reference signal from a received differential signal; (ii) comparing the received differential signal to the common reference signal to provide a comparator output; and (iii) comparing the comparator output to a reference voltage to indicate a valid signal. The method can further include the step of enabling the valid signal detection, for example.

Figure 8:
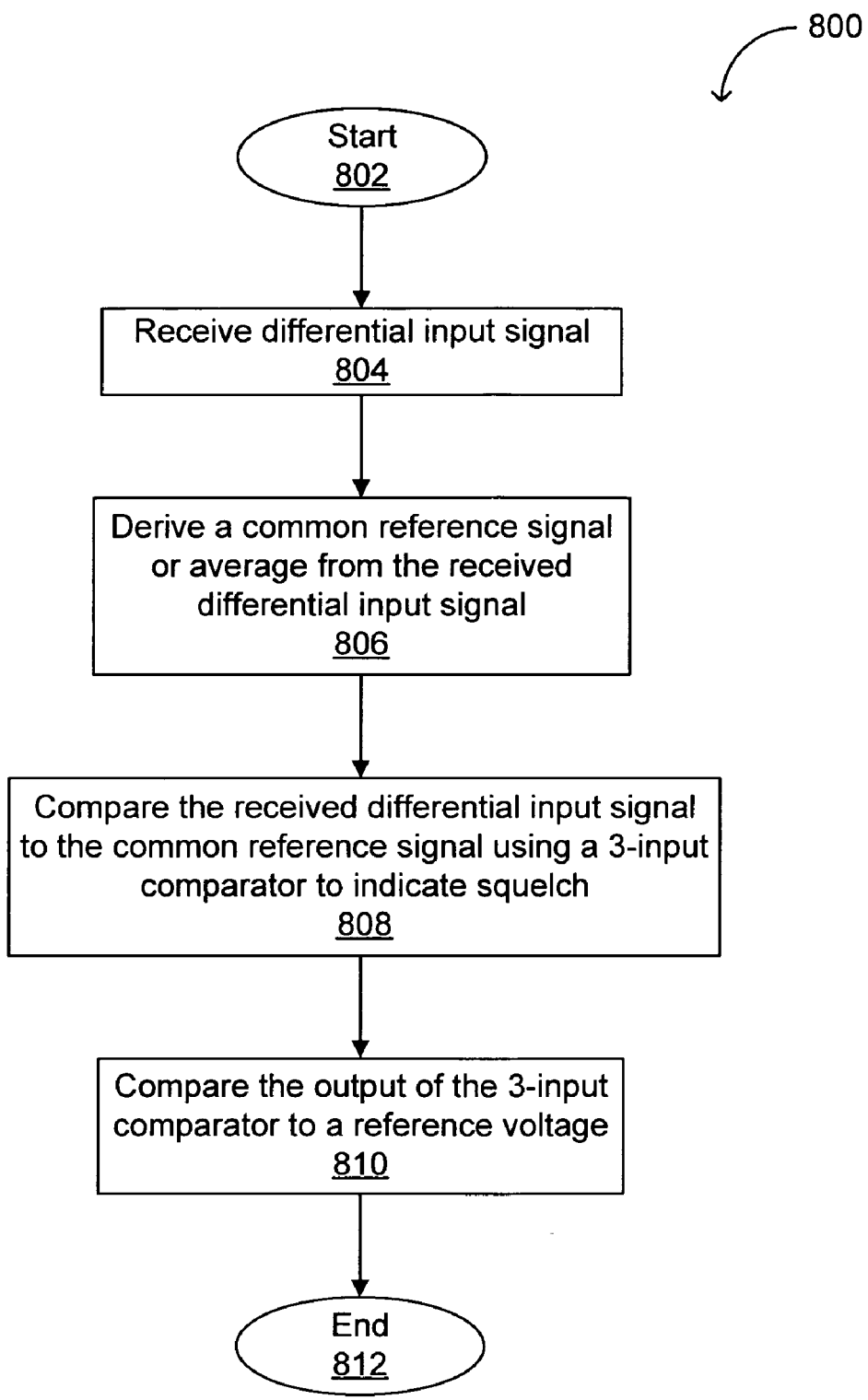
FIG. 8 is a flow diagram showing an exemplary method of providing squelch detection in accordance with embodiments of the present invention.

Referring now to FIG. 8, a flow diagram showing an exemplary method of providing squelch detection in accordance with embodiments of the present invention is indicated by the general reference character 800. The flow can begin (802) and a differential input signal can be received (804). A common reference signal (e.g., a common mode or average voltage level) can be substantially derived from the received differential input signal (806). The received differential input signal can be compared to the common reference signal using a three-input comparator (808). The output of the three-input comparator can be compared to a reference voltage (810) and the flow can complete (812). The final output can be a logic level providing squelch detection or a valid signal indication. Further, this squelch detection or valid signal indication can be suppressed or disabled using a control signal (e.g., during circuit power-up and/or when squelch detection is not required due to an inactive input signal state).

While the above examples include MOS transistor implementations of squelch detection circuitry, one skilled in the art will recognize that other technologies may also be used in accordance with embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A squelch detector, comprising:
    a) a first comparator having first and second inputs configured to receive a differential signal, and a third input configured to receive a signal substantially derived from said differential signal, said first comparator being configured to provide a comparator output; and
    b) a second comparator configured to receive said comparator output and a reference voltage, and to provide a logic level squelch indication;
    wherein the signal received by said third input comprises a common reference signal that is approximately an average voltage of said differential signal.

2. The squelch detector of claim 1, further comprising a plurality of bias signal pathways through which a plurality of bias signals propagate, the plurality of bias signals being configured to control a current in said first and second comparators and a voltage reference circuit, said voltage reference circuit being configured to provide the reference voltage.

3. The squelch detector of claim 2, wherein the reference voltage is selectable.

4. The squelch detector of claim 1, wherein said comparator output is at substantially a maximum value when the signals received by said first and second inputs are approximately equal to the signal received by said third input.

5. The squelch detector of claim 1, further comprising an enable signal input coupled to said second comparator and configured to receive an enable signal that disables said logic level squelch indication when squelch detection is inactive.

6. The squelch detector of claim 1, comprising a common reference circuit configured to provide a common reference signal, said common reference circuit comprising:
    a) first and second resistors coupled between true and complement components of the differential signal and the common reference signal; and
    b) a capacitor coupled between the common reference signal and a ground potential.

7. The squelch detector of claim 6, wherein said common reference circuit further comprises a third resistor and a voltage supply coupled in series between the common reference signal and the ground potential.

8. The squelch detector of claim 1,
    wherein said second comparator comprises a hysteresis function.

9. The squelch detector of claim 1, wherein said comparator output is configured to correspond to a valid differential signal input when either true or complement component of the differential signal is lower than the common reference signal by a predetermined value.

10. A method of detecting squelch in a serial communication system, comprising the steps of:
    a) deriving a common reference signal from a received differential signal;
    b) comparing the received differential signal to the common reference signal to provide a comparator output; and
    c) comparing the comparator output to a reference voltage to indicate a valid signal;
    wherein the step of deriving comprises averaging voltage levels of true and complement components of the received differential signal.

11. The method of claim 10, wherein the step of comparing the received differential signal comprises detecting when either of true and complement components of the received differential signal is less than the common reference signal by a predetermined value.

12. The method of claim 10,
    wherein the step of comparing said comparator output comprises using a two-input comparator having hysteresis.

13. The method of claim 10, further comprising the step of enabling detection of the valid signal.

14. A comparator circuit for squelch detection, comprising:
    a) first and second transistors coupled to a first node, said first and second transistors being controllable by a differential signal;
    b) a third transistor coupled to a second node, said third transistor being controllable by a common reference signal, said first node being charged higher than said second node when either true or complement component of the differential signal is lower than the common reference signal by a predetermined value; and
    c) a differential amplifier stage configured to receive signals at said first and second nodes and to provide a comparator output;
    wherein a plurality of bias signals are used to control currents through said first, second and third transistors, and said differential amplifier stage.

15. The comparator circuit of claim 14, wherein said predetermined value is at least 20 mV.

16. The comparator circuit of claim 14, wherein a gain of the comparator circuit is correlated to sizes of said first, second, and third transistors, and output transistors in said differential amplifier stage.

17. The comparator circuit of claim 14, wherein the common reference signal is derived from the differential signal by a common reference circuit, said common reference circuit comprising:
    a) first and second resistors coupled between true and complement components of the differential signal and the common reference signal; and
    b) a capacitor coupled between the common reference signal and a ground potential.

18. The comparator circuit of claim 17, wherein the common reference signal is approximately an average voltage of true and complement components of the differential signal.

* * * * *